United States Patent
Cycon et al.

(10) Patent No.: US 12,402,419 B2
(45) Date of Patent: Aug. 26, 2025

(54) METHOD FOR MANUFACTURING A LAMINAR LAYERED PHOTOVOLTAIC PANEL AND A LAMINAR LAYERED PHOTOVOLTAIC PANEL MANUFACTURED WITH THE METHOD

(71) Applicant: ML SYSTEM Spoka Akcyjna, Zaczernie (PL)

(72) Inventors: Dawid Cycon, Rzeszow (PL); Pawel Kwasnicki, Rzeszow (PL)

(73) Assignee: ML SYSTEM Spolka Akcyjna, Zaczernie (PL)

( * ) Notice: Subject to any disclaimer, the term of this patent is extended or adjusted under 35 U.S.C. 154(b) by 0 days.

(21) Appl. No.: 18/634,948

(22) Filed: Apr. 14, 2024

(65) Prior Publication Data
US 2024/0347658 A1   Oct. 17, 2024

(30) Foreign Application Priority Data
Apr. 15, 2023   (PL) .......................... 444423

(51) Int. Cl.
*H10F 19/80* (2025.01)
*H10F 71/00* (2025.01)

(52) U.S. Cl.
CPC ......... *H10F 19/807* (2025.01); *H10F 19/804* (2025.01); *H10F 71/137* (2025.01)

(58) Field of Classification Search
CPC .... H10F 19/807; H10F 77/311; H10F 77/315; H10F 77/42
See application file for complete search history.

(56) References Cited

U.S. PATENT DOCUMENTS

| | | | |
|---|---|---|---|
| 2011/0003425 A1* | 1/2011 | Yang | H10F 77/1642 257/E31.119 |
| 2020/0403557 A1* | 12/2020 | Li | H10F 77/169 |

\* cited by examiner

*Primary Examiner* — Christina Chern
(74) *Attorney, Agent, or Firm* — Defillo & Associates, Inc.; Evelyn A. Defillo

(57) ABSTRACT

A method for manufacturing laminar layered photovoltaic panel and a laminar layered photovoltaic panel manufactured with the method. The method includes placing a previously chemically strengthened glass pane in the process chamber of a magnetron device and subject to the ion cleaning process, coating the top surface of the glass pane with a titanium layer using a magnetron sputter deposition method, and onto the uniform titanium layer, ceramic overprints of nanoparticles reproducing refined building material aggregates are made with the use of printing nozzles to obtain an array of micro-objects in the form of toroids, then imeerzing the glass pane in a water solution of hydrofluoric acid and subject to the electrochemical process. The glass pane is placed in a furnace for a thermal fixing process and bound with a float glass pane by lamination with the use of a polymer lamination films having photovoltaic cells.

3 Claims, 4 Drawing Sheets

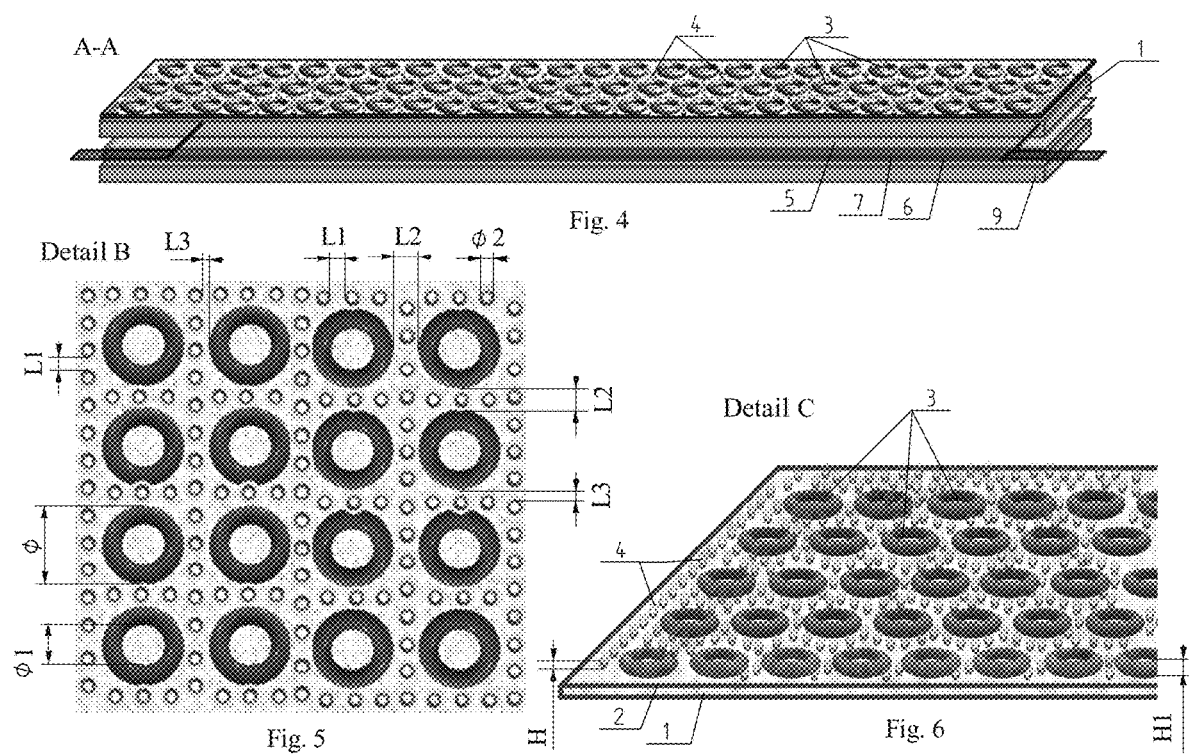

METHOD FOR MANUFACTURING A LAMINAR LAYERED PHOTOVOLTAIC PANEL AND A LAMINAR LAYERED PHOTOVOLTAIC PANEL MANUFACTURED WITH THE METHOD

FIELD OF THE INVENTION

The subject-matter of the invention is a method for manufacturing a laminar layered photovoltaic panel based on a technology of making nanotubes and a laminar layered photovoltaic panel manufactured with the use of such method, the range of application of which includes facings for building facades, photovoltaic tiles, side panels and roofs for vehicles including automobiles, military vehicles, railway cars, trams and other rail vehicles, buses, and sandwich boards used in the building industry.

BACKGROUND OF THE INVENTION

From description of invention disclosed in Polish patent application No. P.432642 known is a glass composite with conductive properties comprising carbon nanotubes and glass and a method of making a conductive surface consisting in mixing single-walled or polyhedral carbon nanotubes in the form of powder in the amount of 1-50 wt. % of the composite with glass in the form of powder with the degree of fineness 0.5 µm-1.0 µm with an addition of an organic disperser, after which the mixture obtained that way is deposited on substrates of electrodes for batteries or reactors and subject to thermal treatment at temperature above 100° C. to obtain a conductive layer which is subject to thermal processing at temperature 700° C. in atmosphere of inert gases.

Description of invention described in Polish patent application No. P.437888 discloses an epoxy composite with absorptive properties relative to electromagnetic radiation, the matrix of which is a cross-linked form of an epoxy resin, whereas the filler securing the desired radiation absorption properties of the composite are carbon nanotubes characterized in that the filler in the form of carbon nanotubes comprises polyhedral carbon nanotubes obtained with the use of the catalytic-chemical deposition method from gaseous phase (CCVD), with purity of 90% and specific surface within the range from 250 $m^2/g$ to 300 $m^2/g$, surface-modified and with intentionally induced surface structural defects, whereas on carbon nanotube surfaces modified that way, amine groups are deposited functioning as an additive improving dispersion of carbon nanotubes, whereas said nanotubes constitute from 0.5 wt. % to 5 wt. % relative to the total composite mass.

Besides, from descriptions of Polish patent applications Nos. PL210946, PL216601, PL225515, PL223267 and P.283373 known are methods for making carbon nanotubes or brominated carbon nanotubes which, however, are not used for the purpose of manufacturing laminar layered photovoltaic panels with layers of chemically strengthened glass.

Commonly known is also the method of carrying out the process of chemical strengthening of glass panes by the ion exchange method in a brine bath resulting in smoothing pane surfaces out, minimizing the number of superficial microcracks and, at the same time, improving their mechanical properties, including the compression strength.

From the present state of the art it follows that no methods of manufacturing laminar layered photovoltaic panels containing nanotubes are known.

SUMMARY OF THE INVENTION

Therefore, the objective of the invention is to provide a new method for manufacturing a laminar layered photovoltaic panel with an active element converting electromagnetic radiation into electric current and a laminar layered photovoltaic panel manufactured with the use of such method ensuring high energy gain at arbitrary angle of orientation of the panel relative to incident radiation and high resistance to environmental conditions, including temperature and humidity, with its high aesthetic qualities easy to retain.

The method of manufacturing a laminar layered photovoltaic panel according to the invention is characterized in that:

a glass pane, previously strengthened chemically by the ion exchange method in a brine bath, is placed in the process chamber of a magnetron device and subject to the ion cleaning process in vacuum conditions on the level of $10^{-4}$ Pa in presence of ionized argon gas with particle energy of the order 1000 eV, after which, a titanium layer (2) with thickness G1=25 nm-30 nm is applied onto top surface of the glass pane with the use of magnetronسputter deposition method (PVD) from a titanium (Ti) target with the purity not less than 99.5% and melting point 1725° C. and at the evaporation pressure $10^{-4}$ Tr and density 16.6 g/cc±10%, the process being carried out at temperature 80° C.-90° C. with the substrate temperature in the range 85° C.-95° C. for the period of 15-20 minutes with voltage being increased gradually from 0 V to 1.6 kV for the first 5 minutes in the course of which the titanium target is bombarded with ions of energy of the order of 1 keV; next, onto the uniform titanium layer obtained that way, ceramic overprints of nanoparticles reproducing refined building material aggregates in their natural color and appearance are applied with the use of eight printing nozzles operating at resolution of 1440 DPI, as a result of which the surface is provided with an array of micro-objects in the form of toroids with outer diameter Ø=0.8 mm-1 mm and inner diameter Ø1=0.4 mm-0.5 mm, separated from each other by distance L2=1 mm-1.25 mm; and then, the so-prepared glass pane with its top surface coated with the titanium layer and with ceramic overprint in the form of toroids, is immersed in 0.29% water solution of hydrofluoric acid and subject to the electrochemical process with the electric field intensity ranging from $10^6$ $Vm^{-1}$ to $10^8$ $Vm^{-1}$ and at the electric current voltage of 12 V-35 V for the period 18 min-20 min and at temperature 30° C.-32° C. as a result of which, on surface of the titanium layer, between ceramic toroids, titanium nanotubes are developing with outer diameter Ø2=25 nm-80 nm, height H=0.5 µm-5 µm, and the distance between titanium nanotubes L1=1 nm-3 nm, while separation of titanium nanotubes from toroids is L3=2 nm-3 nm, and wall thickness of individual titanium nanotubes does not exceed 4 nm; and then, the so-prepared glass pane is placed in a furnace and subject to the thermal fixing process at temperature 560° C.-620° C. for the period 250 s-300 s; after which, the thermally fixed glass pane with the titanium layer with ceramic toroids and titanium nanotubes disposed on its top surface is bound by means of the lamination process with the use of a polymer lamination film (5) with thickness G2=500 μm-0.85 mm and a polymer lamination film (6) with thickness G2=500 μm-0.85 mm on which a set of $1^{st}$ generation or $2^{nd}$ generation or $3^{rd}$ generation photovoltaic cells is disposed equipped with electric wires, with a float-type glass pane with thickness G3=4 mm-6 mm as a result of which a monolithic laminar layered photovoltaic panel is obtained with length L=150 cm-200 cm and width S=50 cm-150 cm.

Favorably, ceramic overprints reproduce a marble or granite or concrete aggregate in its natural color and appearance.

Further, the laminar layered photovoltaic panel manufactured with the use of the method according to the present invention is characterized in that the top surface of its upper glass pane with thickness G=1 mm-4 mm is coated with a sputtered homogenous titanium layer with thickness G1=25 nm-30 nm and covered with an array of ceramic toroids of outer diameter Ø=0.8 mm-1 mm and inner diameter Ø1=0.4 mm-0.5 mm, being separated from each other by distance L2=1 mm-1.25 mm and reproducing crushed building material aggregates in their natural color and appearance; the toroids being further surrounded with titanium nanotubes developed between them with outer diameter Ø2=25 mm-80 nm and height H=0.5 μm-5 μm, separated from each other by L1=1 nm-3 nm and distant from toroids by L3=2 nm-3 nm, whereas a second pane of float glass with thickness G3=4 mm-6 mm is laminated together with said upper glass pane with the use of polymer lamination films with thickness G2=500 μm-0.85 mm.

Favorably, the ceramic toroids reproduce fine marble or granite or concrete aggregates in their natural color and appearance, and the set of photovoltaic cells disposed between the two glass panes and laminated together with them is a set of photovoltaic cells of $1^{st}$ generation or $2^{nd}$ generation or $3^{rd}$ generation.

Application of titanium nanotubes on top surface of the glass pane being one component of the laminar layered photovoltaic panel according to the invention acting as a waveguide system with specifically determined dimensional parameters (diameter and height) allows to maximize the gain rate of solar radiation energy incident onto surface of the photovoltaic panel, as the beam of light with wavelength within the range from 300 nm to 950 nm is effectively transmitted in such waveguide to a photovoltaic cell disposed in the glass laminate. Moreover, radiation from the infrared wavelength band the energy range of which cannot be absorbed by the photovoltaic element is reflected from the panel surface without heating the system up, especially thanks to the use of nanotubes of cylindrical profile. Further, the use of ceramic overprinting technique to form toroids on the top surface of upper glass pane of the laminar layered photovoltaic panel ensures effective transfer of energy carried by electromagnetic wave to the system converting it into electric current in the photovoltaic process. Application of ceramic overprinting with materials containing nanoparticles of materials to be reproduced on surface of the glass pane (e.g. marble nanoparticles for marble, granite nanoparticles for granite, and concrete nanoparticles for concrete) allows to obtain the desired visual effect.

Apart from that, the use of titanium nanotubes with diameter of the order from several to few dozen nanometers makes it possible to control properties of panel surface, including its wettability, photocatalytic activity, and bioactivity. These parameters improve significantly the overall operating effectiveness of the photovoltaic system and guarantee obtaining the desired visual effect (maintaining the color scheme), whereas low wettability improves the hydrophobic effect counteracting accumulation of contaminants, while photocatalytic activity and bioactivity prevents colonization of surface by microorganisms, especially fungi, lichens, and mosses. Moreover, nanotubes developed on the titanium surface improve effectiveness of transfer of electromagnetic wave to the system converting its energy into electric current regardless of the angle of incidence with the desired color scheme of the laminar layered photovoltaic panel surface being maintained.

BRIEF DESCRIPTION OF THE DRAWINGS

FIG. 4 shows the same fragment in the vertical longitudinal cross-section along line A-A of FIG. 1;

FIG. 5 shows an enlarged detail "B" of FIG. 1 of the nanotube-toroid coating in the top view;

FIG. 6 shows an enlarged detail "C" of FIG. 3 of the same nanotube-toroid coating in the perspective view.

DETAILED DESCRIPTION OF THE INVENTION

Figure 1:
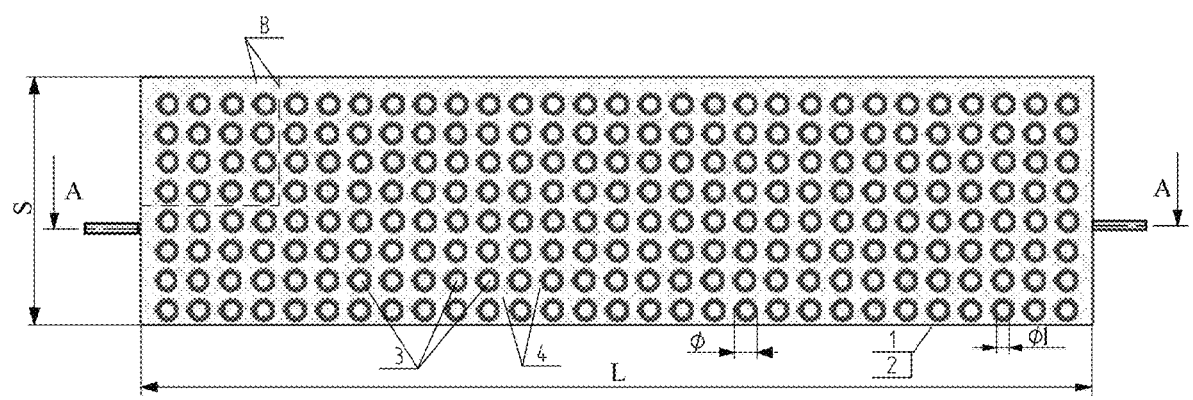
FIG. 1 shows an enlarged top view of a fragment of the rectangular laminar layered photovoltaic panel.
Figure 2:
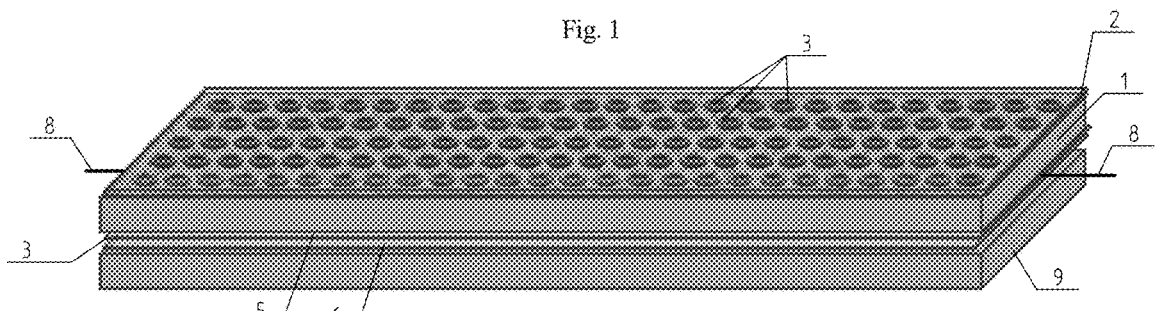
FIG. 2 shows a perspective view of the same fragment of FIG. 1.
Figure 3:
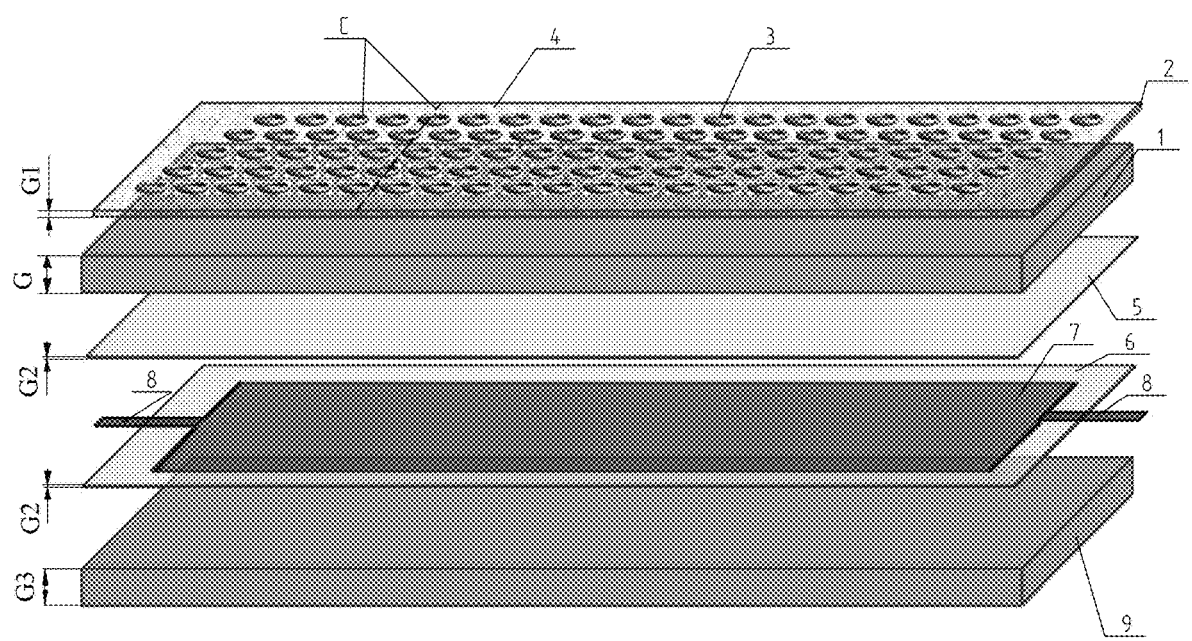
FIG. 3 shows an expanded perspective view of the same fragment of FIG. 1.

The subject-matter of the invention in its example embodiment is described and depicted in drawings of FIGS. 1-7, of which FIG. 1 shows an enlarged top view of a fragment of the rectangular laminar layered photovoltaic panel; FIG. 2—the same fragment in the perspective view; FIG. 3—the same fragment in the expanded perspective view; FIG. 4—the same fragment in the vertical longitudinal cross-section along line A-A of FIG. 1; FIG. 5—enlarged detail "B" of FIG. 1 of the nanotube-toroid coating in the top view; FIG. 6—enlarged detail "C" of FIG. 3 of the same nanotube-toroid coating in the perspective view; and FIG. 7—and example method of fixing the rectangular laminar layered photovoltaic panel to a building facade in vertical cross-section.

EXAMPLE 1

The method of manufacturing the laminar layered photovoltaic panel according to the invention consisted in that it comprised the following six consecutive stages:

in the first step, a glass pane 1 with length L=150 cm, width S=50 cm, and thickness G=1 mm was subject to the chemical strengthening process by means of the ion exchange method in a brine bath to smooth out the pane surface and minimize the number of superficial micro-cracks to improve significantly its mechanical properties, including density and compression strength; after which in the second step, the glass pane prepared that way was placed in the process chamber of a known magnetron device from which air was pumped out to obtain vacuum at the level of $10^{-4}$ Pa and then, ionized argon gas was introduced with particle energy of the order of 1000 eV to subject the pane to the ion cleaning process, and next, onto the top surface of the glass pane 1 prepared that way, a titanium layer 2 with thickness.

G1=25 nm was applied with the use of the magnetron sputter deposition method (PVD) at the process temperature 80° C. and the substrate temperature 85° C., with the use of a titanium target of purity not less than 99.5%, the melting point 1725° C. at the evaporation pressure of $10^{-4}$ Tr and density 16.6 g/cc±10%, whereas the process of magnetron-induced deposition of titanium layer 2 consisted in coating the top surface of said modified glass pane with a material spurred from surface of the titanium target in the form of charged particles sprayed into and interacting with magnetic field, whereas the beam of titanium ions was generated as a result of bombarding the target surface with particles of ionized gas argon as a result of application of electric voltage between surfaces of the carrier and the source. The process was continued for 15 minutes with the voltage being increased gradually from 0 V to 1.6 kV in the period of first 5 minutes in which the titanium target was bombarded by ions with energy of the order of 1 keV;

in the third step, onto the uniform titanium layer 2 deposited on the top surface of glass pane 1 as above described, nanoparticles of finely ground material reproducing marble in its natural color and appearance were applied by means of ceramic overprinting method with the use of eight printing nozzles operating at resolution 1440 DPI to obtain micro-objects of toroidal shape (toroids) 3 with outer diameter Ø=1 mm and inner diameter Ø1=0.5 mm, separated from each other by distance L2=1 mm; next, in the fourth step, the so-prepared glass pane 1 with its top surface coated with the titanium layer 2 and with the ceramic overprint in the form of toroids 3, was immersed in 0.29% water solution of hydrofluoric acid and subject to electrochemical processing at the electric field intensity amounting to $10^6$ Vm$^{-1}$ and the electric current voltage of 12 V for the period of 18 min and at temperature 30° C., as a result of which in those portions of surface of the titanium layer 2 on which ceramic toroids 3 were not overprinted, titanium nanotubes 4 developed with outer diameter Ø2=25 nm, height H=0.5 μm, individual nanotube wall thickness of 4 nm, the distance between individual titanium nanotubes L1=1 nm, and the distance of nanotubes from toroids L3=2 nm, whereas the process of development of the nanotubes around ceramic toroids occurred under the influence of the generated electric field enabling migration of ions towards the metal phase boundary and the developing layer of nanotubes, and then further towards the boundary with electrolyte. The applied voltage generated electric field enabling metal ions to surpass the energy barrier and diffuse from metallic phase to oxide phase, which was followed by the process of migration of ions through the oxide layer towards the oxide-electrolyte boundary;

in the fifth step, the glass pane 1 so prepared in the fourth step, was placed in a furnace and subject to thermal fixing process at temperature 560° C. for the period of 250 s; after which, in the sixth step, the thermally fixed glass pane 1 with titanium layer 2, toroids 3, and titanium nanotubes 4 was laminated, with the use of a polymer lamination film 5 of EVA type with thickness G2=500 μm and a polymer lamination film 6 of EVA type with thickness G2=500 μm with a set 7 of photovoltaic cells of 1$^{st}$ generation disposed on the film and provided with electric wires 8, with a float-type glass pane 9 with thickness G3=4 mm, as a result of which a monolithic laminar layered photovoltaic panel was obtained.

EXAMPLE 2

The method of manufacturing the laminar layered photovoltaic panel according to the invention consisted in that it comprised the following six consecutive stages:

in the first step, a glass pane 1 with length L=250 cm, width S=150 cm, and thickness G=4 mm was subject to the chemical strengthening process by means of the ion exchange method in a brine bath to smooth the pane surface out, minimize the number of superficial micro-cracks, and significantly improve its mechanical properties, including density and compression strength; and then in the second step, the glass pane prepared that way was placed in the process chamber of a known magnetron device from which air was pumped out to obtain vacuum at the level of $10^{-4}$ Pa and next, ionized argon gas was introduced with particle energy of the order of 1000 eV to subject the pane to the ion cleaning process; further, the top surface of the glass pane was coated with a titanium layer 2 with thickness G1=30 nm from a titanium (Ti) target with the purity not less than 99.5%, the melting point 1725° C. at the evaporation pressure of $10^{-4}$ Tr, and density 16.6 g/cc±10% by means of the magnetron sputter deposition method (PVD) at the process temperature 90° C. and the substrate temperature 95° C., whereas the process of magnetron-induced deposition of titanium layer 2 consisted in coating the top surface of said modified glass pane with a material emerging from surface of a titanium target in the form of charged particles sprayed into and interacting with magnetic field, whereas the beam of titanium ions was generated as a result of bombarding the target surface with particles of ionized gas argon as a result of application of electric voltage between surfaces of the carrier and the source. The process duration was 20 minutes with the voltage increased gradually from 0 V to 1.6 kV within the period of first 5 minutes wherein the titanium target was bombarded with gas ions of energy of the order of 1 keV;

in the third step, onto the uniform titanium layer 2 deposited of top surface of the glass pane 1 as above described, nanoparticles of finely ground material reproducing granite in its natural color and appearance were disposed by means of the ceramic overprinting method with the use of eight printing nozzles operating at resolution of 1440 DPI, obtaining thus toroidal micro-objects (toroids) 3 with outer diameter Ø=0.8 mm and inner diameter Ø1=0.4 mm, separated from each other by distance L2=1.25 mm; and next, in the fourth step, the so-prepared glass pane 1 with its top surface coated with the titanium layer 2 and with overprint in the form of ceramic toroids 3 was immersed in 0.29% water solution of hydrofluoric acid and subject to the electrochemical process in which the electric field intensity amounted to $10^8$ Vm$^{-1}$ at the applied electric current voltage of 35 V, carried out for the period of 20 min and at temperature 32° C., as a result of which on those areas of surface of the titanium layer 2 where ceramic toroids 3 were not overprinted and around them, titanium nanotubes 4 developed with outer diameter Ø2=80 nm, height H=5 μm, individual nanotube wall thickness 4 nm, the distance between individual nanotubes L1=3 nm, and the distance between nanotubes and toroids L3=3 nm, whereas the process of development of nanotubes progressed under the influence of the generated electric field forcing the metal ions to migrate towards the metal phase boundary and the developing layer of nanotubes, and then further towards the boundary with electrolyte. The applied voltage generated electric field enabling metal ions to surpass the energy barrier and diffuse from metallic phase to oxide phase, after which the process of migration of ions occurred through the oxide layer towards the oxide-electrolyte boundary;

in the fifth step, the glass pane 1 so prepared in the fourth step, was placed in a furnace and subject to the thermal fixing process at temperature 620° C. for 300 s; after which in the sixth step, the glass pane 1 with thermally fixed titanium layer 2, toroids 3, and titanium nanotubes 4 was laminated together with a float-type glass pane 9 with thickness G3=6 mm by means of a polymer lamination film 5 of EVA type with thickness G2=0.85 mm and a polymer lamination film 6 of EVA type with thickness G2=0.85 mm on which a set 7 of $1^{st}$ generation photovoltaic cells provided with electric wires 8 was disposed, obtaining thus a monolithic laminar layered photovoltaic panel.

In subsequent example embodiments of the method for manufacturing laminar layered photovoltaic panel according to the invention, the ceramic overprinting process was used to obtain a coating of toroids reproducing the pattern and color of concrete, and instead of EVA type polymer lamination film, a PVB-type polymer lamination film was used.

EXAMPLE 3

The laminar layered photovoltaic panel manufactured with the use of the method according to the invention comprised:

a glass pane 1 with length L=150 cm, width S=50 cm, and thickness G=1 mm, strengthened chemically by means of the ion exchange method in a brine bath, with its top surface coated with a spurred uniform titanium layer 2 with thickness G1=25 nm and overprinted ceramic toroids 3 reproducing marble in its natural color and appearance, said toroids having outer diameter Ø=1 mm, inner diameter Ø1=0.5 mm, and separated from each other by L2=1 mm, and further provided with titanium nanotubes 4 with outer diameter Ø2=25 nm, height H=0.5 μm, and the distance between individual nanotubes L1=1 nm, said nanotubes being arranged between and surrounding toroids 3, whereas the distance between titanium nanotubes 4 and toroids 3 was L2=2 nm and wall thickness of individual titanium nanotube was 4 nm, and a float-type glass pane 9 with thickness G3=4 mm, whereas between the glass panes 1 and 9, a polymer lamination film 5 of EVA type with thickness G2=500 μm was placed as well as another polymer lamination film 6 of EVA type with thickness G2=500 μm on which with a set 7 of $1^{st}$ generation photovoltaic cells provided with electric wires 8 was placed, said polymer lamination films 5 and 6 being used then to bind the glass panes 1 and 9 together by means of the lamination method and form that way a monolithic laminar layered photovoltaic panel.

EXAMPLE 4

In this example embodiment, the laminar layered photovoltaic panel manufactured with the use of the method according to the invention comprised:

a glass pane 1 of length L=200 cm, width S=150 cm, and thickness G=4 mm strengthened chemically by means of the ion exchange method in a brine bath with its surface coated with a spurred uniform titanium layer 2 with thickness G1=30 nm and overprinted ceramic toroids 3 reproducing granite in its natural color and appearance, the toroids having outer diameter Ø=0.8 mm, inner diameter Ø1=0.4 mm, and being separated from each other by distance L2=1.25 mm, and with titanium nanotubes 4 distributed between and surrounding toroids 3, said nanotubes having outer diameter Ø2=80 nm, height H=5 μm, and wall thickness 4 nm, with the distance between individual nanotubes equaling L1=3 nm and the distance between nanotubes 4 and toroids 3 L2=3 nm, and a float-type glass pane 9 with thickness G3=6 mm, whereas between the glass panes 1 and 9, a polymer lamination film 5 of EVA type with thickness G2=0.85 mm is placed as well as other polymer lamination film 6 of EVA type with thickness G2=0.85 mm on which with a set 7 of $1^{st}$ generation photovoltaic cells equipped with electric wires 8 was placed, these lamination films 5 and 6 being used then to bind the glass panes 1 and 9 together by means of the lamination method and form that way a monolithic laminar layered photovoltaic panel.

In further example embodiments of the method for manufacturing laminar layered photovoltaic panel according to the invention, the overprinted toroids reproduced concrete in its natural color and appearance, whereas the polymer lamination film of EVA type was replaced with a polymer lamination film of PVB type.

Figure 7:
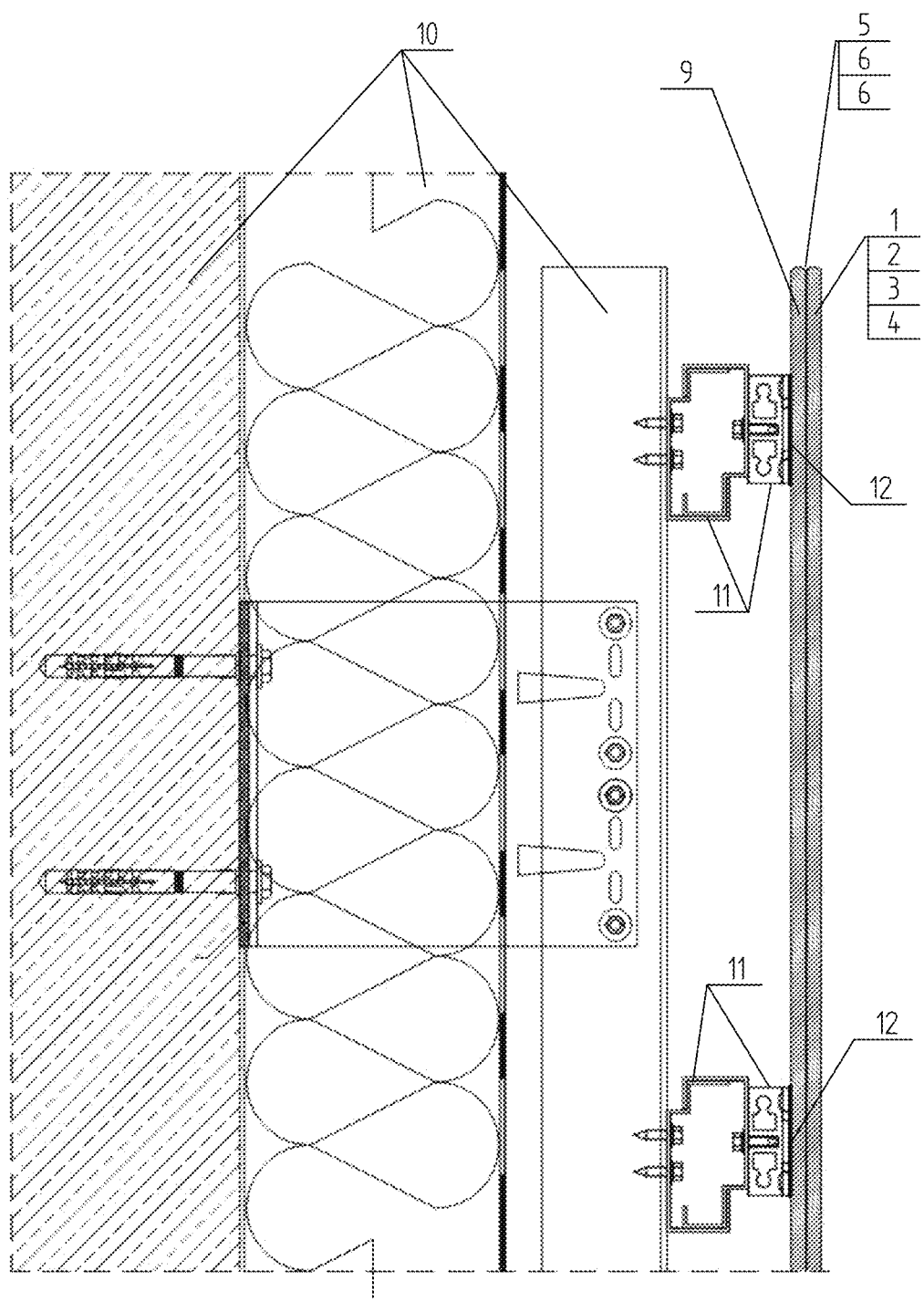
FIG. 7 shows an example method of fixing the rectangular laminar layered photovoltaic panel to a building facade in vertical cross-section.

An example of mounting the laminar layered photovoltaic panel to a building facade 10 shown in drawing of FIG. 7 consists in that a silicone adhesive 12 is used to glue flat surfaces of glass panes 9 of the laminar layered photovoltaic panel to the facade front wall provided with bearing structures 11 having flat outer surfaces.

LEGEND TO FIGS. 1-7

1 top glass pane
2 uniform titanium layer
3 overprinted ceramic toroidal micro-object
4 titanium nanotube
5,6 EVA polymer lamination film
7 photovoltaic cell set
8 electric wire
9 float glass pane
10 building facade
11 bearing element
12 silicone adhesive

The invention claimed is:

1. A method for manufacturing a monolithic laminar layered photovoltaic panel, the method is carried out in consecutive stages comprising:

a glass pane (1), chemically strengthened by an ion exchange method in a brine bath, is placed in a process chamber of a magnetron device and subject to an ion cleaning process in vacuum conditions on the level of $10^{-4}$ Pa in the presence of ionized argon gas with a particle energy of the order of 1000 eV, after which a titanium layer (2) with thickness G1=25 nm-30 nm is applied onto a top surface of the glass pane (1) by a magnetron sputter deposition method (PVD) using a titanium (Ti) target with a minimum purity of 99.5%, a melting point of 1725° C. at a evaporation pressure $10^{-4}$ Tr, and a specific density of 16.6 g/cc±10%, the sputtering being carried out at a temperature between 80° C.-90° C. and a substrate temperature between 85° C.-95° C. for a period 15 min-20 min and with a voltage increasing gradually from 0 V to 1.6 kV for a period of the first 5 minutes in the course of which the titanium target is bombarded with gas ions with energy of the order of 1 keV; after which the obtained uniform titanium layer (2) is provided with ceramic overprints of nanoparticles reproducing fine building material aggregates in their natural color and appearance with the use of printing nozzles operating at resolution 1440 DPI to obtain micro- objects in the form of toroids (3) with an outer diameter $\varnothing=0.8$ mm-1 mm and an inner diameter $\varnothing1=0.4$ mm-0.5 mm separated from each other by a distance $L2=1$ mm-1.25 mm; and then, the glass pane (1) with the top surface with the titanium layer (2) and the overprinted toroids (3) is immersed in 0.29% solution of hydrofluoric acid and subject to an electrochemical process with an electric field intensity amounting to from $10^6$ $Vm^{-1}$ to $10^8$ $Vm^{-1}$ an electric current voltage of 12 V-35 V for a period of 18 min-20 min and at a temperature of 30° C.-32° C. as a result of which, on the surface of the titanium layer (2) and between the ceramic toroids (3), titanium nanotubes (4) are formed with outer diameter $\varnothing2=25$ nm-80 nm, height $H=0.5$ μm-5 μm, distance between titanium nanotubes (4) $L1=1$ nm-3 nm, distance between titanium nanotubes (4) and toroids (3) $L3=2$ nm-3 nm, and wall thickness of an individual titanium nanotube (4) not exceeding 4 nm; after which, the glass pane (1) is placed in a furnace and subject to a thermal fixing process at a temperature of 560° C.-620° C. for a period of 250 s-300 s; next, the thermally fixed glass pane (1) with the titanium layer (2), the toroids (3), and the titanium nanotubes (4) deposited on its top surface, is bound, with the use of a polymer lamination film (5) with thickness $G2=500$ μm-0.85 mm and another polymer lamination film (6) with thickness $G2=500$ μm-0.85 mm on which a set (7) of 1st generation or 2nd generation or 3rd generation photovoltaic cells provided with electric wires (8) is disposed, with a float-type glass pane (9) with thickness $G3=4$ mm-6 mm by means of the lamination process to obtain the monolithic laminar layered photovoltaic panel of length $L=150$ cm-200 cm and width $S=50$ cm-150 cm.

2. The method according to claim 1, wherein the fine building material aggregates of the ceramic overprints are composed of marble or granite or concrete aggregates.

3. A laminar layered photovoltaic panel manufactured according to the method of claim 1, wherein the fine building material aggregates of the ceramic toroids (3) are composed of marble or granite or concrete aggregates.

* * * * *